(12) United States Patent
Schemmann et al.

(10) Patent No.: US 6,711,190 B2
(45) Date of Patent: Mar. 23, 2004

(54) LASER TRANSMITTER BIAS CIRCUIT

(75) Inventors: Marcel F. C. Schemmann, Echt (NL); Venkatesh G. Mutalik, Manlius, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 180 days.

(21) Appl. No.: 09/896,377

(22) Filed: Jun. 29, 2001

(65) Prior Publication Data

US 2003/0002550 A1 Jan. 2, 2003

(51) Int. Cl.[7] .............................. H01S 3/00; H01S 3/13
(52) U.S. Cl. .............................. 372/38.02; 372/29.012; 372/29.015
(58) Field of Search ........................ 372/38.02, 29.012, 372/29.015

(56) References Cited

U.S. PATENT DOCUMENTS

| | | | |
|---|---|---|---|
| 4,451,766 A | * 5/1984 | Angle et al. | 315/248 |
| 5,402,433 A | 3/1995 | Stiscia | |
| 5,444,728 A | 8/1995 | Thompson | |
| 5,563,898 A | 10/1996 | Ikeuchi et al. | |
| 5,754,577 A | * 5/1998 | Casper et al. | 372/38 |
| 5,930,276 A | 7/1999 | Dou et al. | |
| RE36,491 E | 1/2000 | Gilliland et al. | |
| 6,130,562 A | 10/2000 | Bosch et al. | |
| 6,151,346 A | * 11/2000 | Partlo et al. | 372/38 |
| 6,160,647 A | 12/2000 | Gilliland et al. | |

* cited by examiner

*Primary Examiner*—George Eckert
*Assistant Examiner*—Joseph Nguyen
(74) *Attorney, Agent, or Firm*—Michael E. Belk (57) ABSTRACT

A laser transmitter bias circuit for a laser diode transmitter, for use in a optical transmission system, e.g. in commercial CATV systems. The laser transmitter bias circuit reduces power consumption and heat dissipation by eliminating the conventional need for a distinct constant DC current supply for biasing the laser diode. Radio frequency (RF) circuitry, e.g., a radio frequency amplifier (e.g., a Hybrid Amplifier), connected in series to the laser diode supplies both a DC bias-current ($I_B$) and an RF drive-current ($I_P$) through the laser diode. The DC bias current through the laser diode in turn powers (and/or biases) the radio frequency amplifier and, optionally, other radio frequency circuitry. An optional diode-bypass current ($I_{BP}$) path may be connected in parallel with the laser diode, and in series with the radio frequency amplifier to control bias current.

14 Claims, 7 Drawing Sheets

LASER TRANSMITTER BIAS CIRCUIT

BACKGROUND OF THE INVENTION

1. Technical Field

This invention relates generally to a semiconductor laser drive circuit, more particularly, to a semiconductor laser drive of use in an optical transmitter, having immediate applications in commercial CATV systems.

2. Related Art

Commercial terrestrial Cable Television (CATV) systems typically utilize optical links (e.g., fiber-optic cable, with RF transmitter-receiver pairs) to carry radio frequency (RF) digital signals over long distances. The light-producing component is typically a semiconductor laser diode operating in forward bias mode.

The forward bias of the semiconductor laser diode is maintained by a DC current generally referred to as the bias current ($I_B$). A semiconductor laser emits light when a diode current ($I_D$) flowing through it exceeds a threshold value ($I_{TH}$), the value of which may vary from diode to diode, and may vary in a particular diode during operation due to operational conditions such as temperature. Generally, the bias current $I_B$ is controlled so as to establish and maintain the relation $I_B \approx I_{TH}$. Radio frequency (RF) signals expressed as a RF modulated electrical current ($I_P$) are superimposed upon the DC bias current ($I_B$) through the laser diode to obtain modulated light signals that will carry the RF information long distances (e.g., through a fiber optic cable physically and optically coupled to the laser diode). The current flowing through the laser diode ($I_D$) during operation is therefore equal to the sum of the currents $I_P$ plus $I_B$. The amperage of bias current $I_B$ can be larger or smaller than the maximum amplitude of RF modulated current $I_P$.

Figure 1:
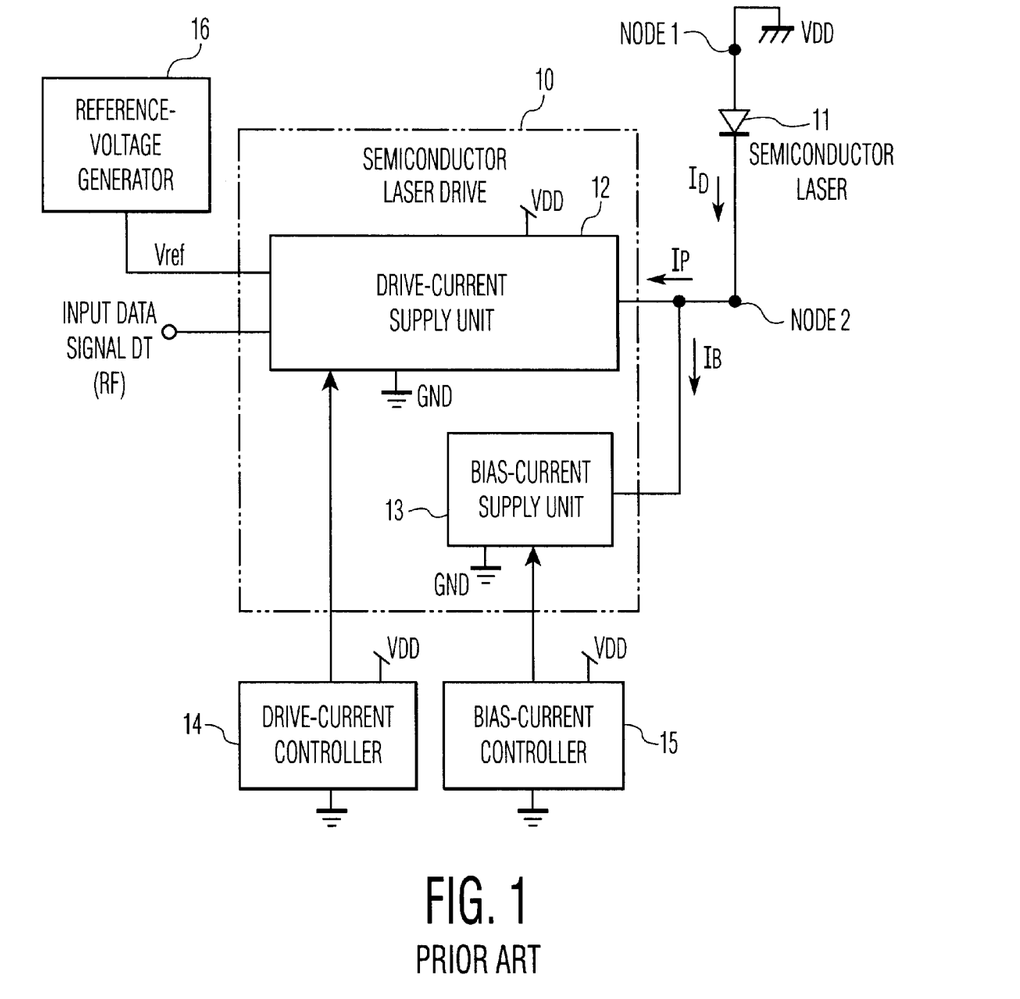
FIG. 1 is block diagram depicting an overview of a typical topology of the semiconductor laser drive circuits of the related art.

FIG. 1 is derived from FIG. 1 of U.S. Pat. No. 5,563,898, issued to Ikeuchi, (incorporated herein by reference except for the parenthetical references to "ground" in FIGS. 11 and 13 thereof) and is representative of the related art's approach to supplying bias current ($I_B$) and RF modulated electrical current ($I_P$) to the laser diode 11. The related art generally teaches that a distinct drive-current ($I_P$) supply unit 12 (powered by the full supply voltage $V_{DD}$) plus a distinct bias-current ($I_B$) supply unit 13 (connected between GND and the laser diode 11), are both necessary to provide and regulate the current $I_D$ (e.g., $I_D = I_P + I_B$) through the laser diode 11. The related art generally teaches that the such a distinct bias-current ($I_B$) supply unit 13 should be connected in parallel with the drive-current ($I_P$) supply unit 12 between a terminal (Node2) of the laser diode 11 and ground. Thus, in the related art, the electrical power that is consumed in the drive-current ($I_P$) supply unit 12 to provide bias current ($I_B$) to the laser diode 11 is essentially dissipated as waste heat, and does not power the operation of the drive-current ($I_P$) supply unit 12. Therefore, the semiconductor laser drive circuits of the related art are not as power-efficient as the present invention discloses that a semiconductor laser drive circuit can be. There is a need for a power efficient method and apparatus for transmitting RF signals through an optical medium.

SUMMARY OF THE INVENTION

The present invention overcomes the disadvantages of the semiconductor laser drive circuits of the related art. The disclosed invention has applications in cable television (CATV) distribution networks as well as in many other applications involving fiber-optic transmission of RF signals. RF digital signals that may be transmitted using the inventive semiconductor laser drive circuits and methods may include QAM (e.g., M-ary Quadrature Amplitude Modulated), Baseband, QPSK and other types.

The present invention exploits the observation that a typical semiconductor laser diode, such as laser diode 11 shown in FIG. 1, typically operates with a significant bias current ($I_B$) but with a forward bias voltage drop ($V_{FB}$) across its terminals (i.e., measured between Node 1 and Node 2) that is very small compared to supply voltage $V_{DD}$ needed to operate RF components such as a drive-current supply unit (e.g., an RF Amplifier). The present invention further exploits a discovery that such RF components generally can operate at a reduced supply voltage $V_D$ that is less than the typical full supply voltage $V_{DD}$ (e.g., Vdd=24 volts), and that $V_D$ may be equal to $V_{DD}$ minus $V_{FB}$. Accordingly, the invention provides semiconductor laser drive circuits wherein the DC bias current ($I_B$) through the laser diode 11 is used to power the RF components of the laser drive circuits (e.g., in 12) rather than being dissipated as heat (e.g., in 13), and thus eliminating the need for a distinct bias-current ($I_B$) supply unit 13 as was required in the related art circuit shown in FIG. 1.

In a first general aspect, the present invention provides an apparatus comprising: a laser diode having a DC bias-current (IB) and a radio frequency (RF) modulated RF drive-current (IP); and a drive-current supply unit adapted to pass the DC bias-current (IB) and the RF drive-current (IP) through said laser diode, wherein said drive-current supply unit includes at least an output stage of a radio frequency (RF) amplifier (e.g., a Hybrid) that passes the RF drive-current (IP) and at least a portion of the DC bias-current (IB).

In a second, more particular, aspect the present invention provides an apparatus comprising: a laser diode having a DC bias-current (IB) and an RF drive-current (IP); and a push-pull (Hybrid) RF amplifier connected in series with the laser diode between the supply voltage (VDD) and ground, wherein the push-pull (Hybrid) RF amplifier passes the RF drive-current (IP) and at least a portion of the DC bias-current (IB).

In a third general aspect, the present invention provides an apparatus comprising: a laser diode having a DC bias-current (IB) and an RF drive-current (IP); a drive-current supply unit for passing the DC bias-current (IB) and the RF drive-current (IP) through said laser diode, wherein said drive-current supply unit includes at least an output stage of a radio frequency (RF) amplifier that passes the RF drive-current (IP) and at least a portion of the DC bias-current (IB); and a diode-bypass current (IBP) path, wherein the diode-bypass current (IBP) path is connected in parallel with the laser diode, and the diode-bypass current (IBP) path is connected in series with the drive-current supply unit.

In a fourth general aspect, the present invention provides a semiconductor laser drive circuit for driving a laser diode having a DC bias-current (IB) and an RF drive-current (IP), comprising: circuitry for passing the DC bias-current (IB) through said laser diode, wherein said circuitry includes at least an output stage of a radio frequency (RF) amplifier that passes at least a portion of the DC bias-current (IB), In a fifth general aspect, the present invention provides a semiconductor laser drive circuit for passing a DC bias-current (IB) and an RF drive-current (IP) through a laser diode, the circuit comprising radio frequency (RF) circuitry adapted to RF modulate the RF drive-current (IP) and further adapted to pass the DC bias-current (IB).

In a sixth general aspect, the present invention provides an apparatus comprising a laser diode having a DC bias-current (IB) and an RF drive-current (IP); and radio frequency (RF) circuitry that passes at least a portion of the DC bias-current (IB) and the RF drive-current (IP).

In a seventh general aspect, the present invention provides an optical transmission system comprising: an optical signal transmitter for transmitting RF signals, the transmitter including a laser transmitter bias circuit; an optical signal receiver; an optical link medium being operatively connected between the optical signal transmitter and the optical signal receiver; wherein the laser transmitter bias circuit includes: a laser diode having a DC bias-current (IB) and an RF drive-current (IP); a drive-current supply unit adapted to pass the DC bias-current (IB) and the RF drive-current (IP) through said laser diode, wherein said drive-current supply unit includes at least an output stage of a radio frequency (RF) amplifier that passes the RF drive-current (IP) and at least a portion of the DC bias-current (IB).

In a eighth general aspect, the present invention provides a method for communicating radio frequency (RF) informational signals through an optical link medium, said method comprising: providing an optical signal transmitter for transmitting RF signals, the transmitter including a laser transmitter bias circuit, wherein the laser transmitter bias circuit includes: a laser diode having a DC bias-current (IB) and a radio frequency (RF) modulated RF drive-current (IP); and a drive-current supply unit adapted to pass the DC bias-current (IB) and the RF drive-current (IP) through said laser diode, wherein said drive-current supply unit includes at least an output stage of a radio frequency (RF) amplifier that passes the RF drive-current (IP) and at least a portion of the DC bias-current (IB).

The foregoing and other features and advantages of the invention will be apparent from the following more particular description of embodiments of the invention.

BRIEF DESCRIPTION OF THE DRAWINGS

The features and inventive aspects of the present invention will become more apparent upon reading the following detailed description, claims, and drawings, of which the following is a brief description.

It should be noted that the same element numbers are assigned to components having the same, or approximately the same functions and structural features. Thus, elements in different figures and labeled with the same element number may be identical, or substantially similar in composition, structure and/or function, and where the function of such element has been explained, there is no necessity for repeated explanation thereof in the detailed description.

DETAILED DESCRIPTION OF THE INVENTION

As already noted, FIG. 1 is block diagram depicting an overview of a typical topology of the semiconductor laser drive circuits of the related art. During operation, the bulk of the current $I_D$ passing through the semiconductor laser diode 11 will be conducted into and through the distinct bias-current supply unit (13) and will be therein dissipated as waste heat.

Figure 2:
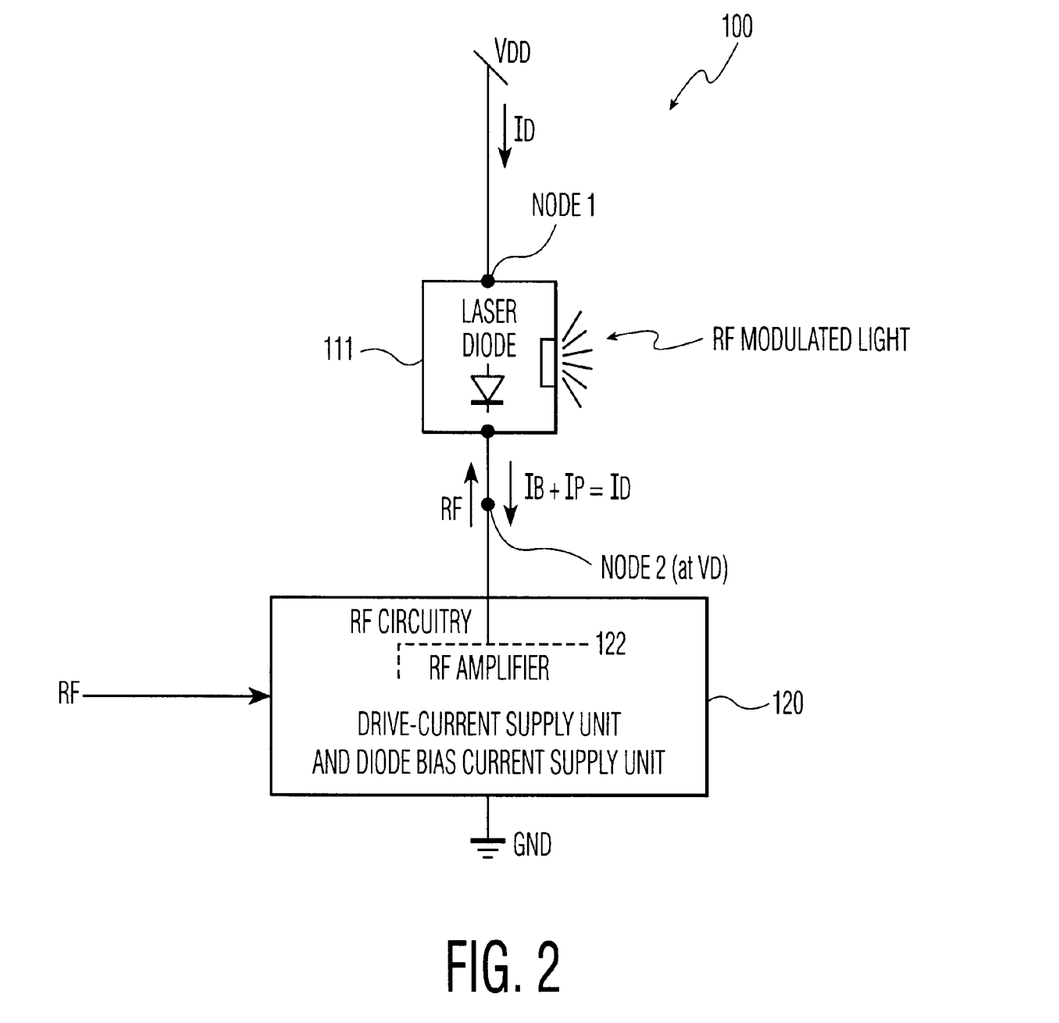
FIG. 2 is a block diagram depicting a general topology of a simple RF laser drive circuit wherein the laser diode bias current is provided by and powers RF circuitry connected in series with the laser diode, in accordance with embodiments of the invention.

FIG. 2 is a block diagram depicting a general topology of a RF laser drive circuit 100 wherein the laser diode's (111) bias current ($I_B$) is provided by and powers at least the output stage of an RF amplifier 122 (and/or other RF circuitry 120) connected in series with the laser diode (111), in accordance with embodiments of the invention. The RF circuitry 120 may generally comprise RF circuits ordinarily present in the RF stages of a RF laser transmitter. The term "RF circuitry" as used in the claims will not include a DC current path between the laser diode 111 and ground GND that is provided solely to pass DC bias current $I_B$ nor a portion thereof. The diode 111 (referred to generally herein as a laser diode) may be identical to the laser diode 11 employed in the related art as shown in FIG. 1, or any laser diode now or ever known to persons skilled in the art. Alternatively, the "laser" diode 111 may be a simple light emitting diode (LED), or diode 111 may be a plurality of parallel-connected (i.e., connected in parallel between Node1 and Node2) LEDS and/or laser diodes (e.g., outputting various lightwave frequencies, polarizations, and/or phases). The radio frequency signal RF is supplied to the RF circuitry 120 and used therein to modulate the drive-current $I_P$, and may be transmitted (as the RF modulated light) through an inventive RF digital signal transmission system (see, e.g., FIG. 7). The radio frequency signal RF may be and/or include QAM (e.g., M-ary Quadrature Amplitude Modulated), Baseband, QPSK and other known types of signals. The radio frequency signal RF, although nominally, "radio frequency" may be presented to the nominal RF circuitry 120 of the circuit 100 at lower than "radio" frequencies, (e.g., at audio frequencies or at much higher frequencies) as individual device (e.g., diode, capacitor, transistor) characteristics permit. The RF circuitry 120 to be supplied by the laser diode's (111) bias current ($I_B$) at $V_D$ on Node2 may include an RF amplifier circuit 122 or at least the RF output stage thereof. The RF circuitry nominally labeled 120 in FIG. 2 may be and represent any one of the specific and alternative embodiments of RF circuitry depicted in subsequent Figures, e.g., 120B, 120C, 120D or of many other specific alternative embodiments that would be known by persons skilled in the art (e.g., the circuit 12 in FIG. 2 in the Ikeuchi patent, when supplied by $V_D$ rather than $V_{DD}$).

In the topology of FIG. 2, the laser diode's (111) DC bias current ($I_B \approx I_{TH}$) is the same as the current powering the RF circuitry 120 (which includes circuits that function as a drive-current supply unit and circuits that function as a bias-current supply unit) within the RF laser drive circuit 100. RF circuitry 120 passes both the RF drive-current $I_P$ and the DC bias current ($I_B$). At any given supply voltage $V_{DD}$, the power consumed (and heat dissipated) by laser diode 111 (e.g., laser diode 11) plus RF circuitry 120 operating in the topology of circuit 100 will generally be less than (e.g., sometimes half) the power that would be consumed to control and power the laser diode 11 plus the RF circuitry (e.g, within drive current supply unit 12) operating in the topology of FIG. 1. The power consumption of the entire RF laser drive circuit 100 will be independent of the laser diode's (111) current ($I_B$) requirements. Specifically, in various embodiments of the invention, the optical power output $P_O$ of laser diode (111) during operation, will have no significant effect upon the total power consumption of (and heat dissipated in) the RF laser drive circuit 100.

Figure 3:
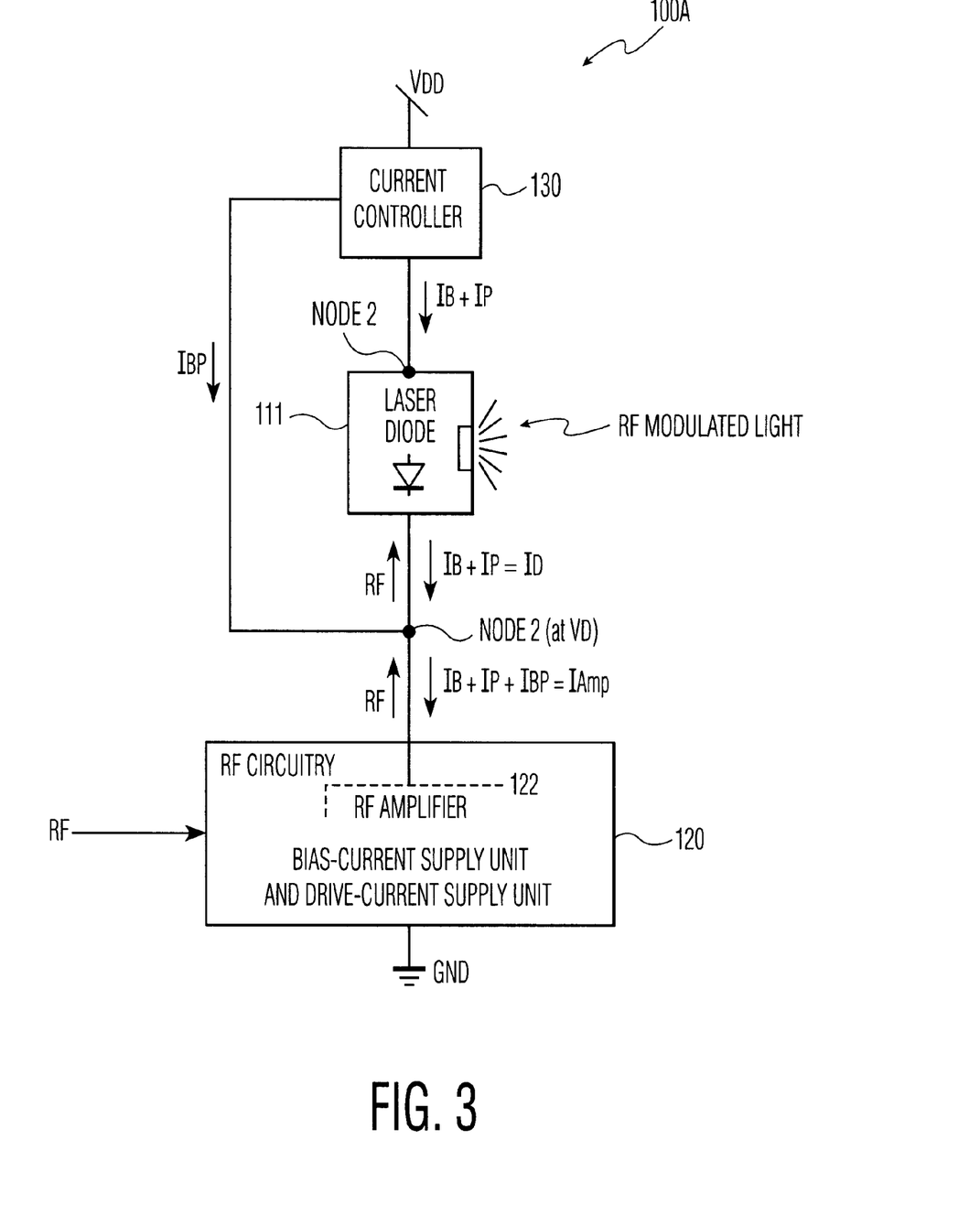
FIG. 3 is a block diagram depicting a general topology as in FIG. 2, wherein current controller is added to regulate the current through the laser diode and into the RF circuitry connected in series with the laser diode.

FIG. 3 is a block diagram depicting a general topology of an RF laser drive circuit 100A similar to circuit 100 in FIG. 2, wherein a current controller 130 is added (in series and/or in parallel with the laser diode 111) to regulate the DC current $I_B$ flowing through the laser diode 111 and into the RF circuitry 120 (e.g., including RF amplifier 122) connected in series with the laser diode 111. The laser diode-bypassing current controller 130 functions to regulate the current $1_B$ through the laser diode 111 and/or to supply necessary current to power the RF circuitry 120. The current controller 130 may be implemented with one or a plurality of transistors (as in supply unit 13 in FIG. 2 of the Ikeuchi patent) or variable resisters, potentiometers, etc. connected in series, and/or in parallel with the laser diode 111. In many cases (and by design), the DC current required by the RF circuitry 120 will be greater than the bias current ($I_B \approx I_{TH}$) of the laser diode 111. Thus, in many cases the current controller 130 will be implemented as a parallel laser-bypass current ($I_{BP}$) path (e.g., having controllable resistance) connected parallel to the laser diode 111 between Node1 and Node 2. The laser-bypass current ($I_{BP}$) combines with the bias current ($I_B \approx I_{TH}$) through the laser diode 111 at Node2 and enters and powers the RF circuitry 120. Thus, the RF circuitry 120 passes the RF drive-current $I_P$ and the DC bias current ($I_B$) and DC diode bypass-current ($I_{BP}$). The composite DC current $I_B + I_{BP}$ supplies the current required to power the RF circuitry 120. The addition of the laser-bypassing current ($I_{BP}$) path in parallel with the laser diode 111 does not reduce the power efficiency of the circuit 100A (e.g., versus the power efficiency of circuit 100 as implemented without such a bypass current) because all the current $I_{AMP}$ supplied to the RF circuitry 120 is usefully employed to power the RF circuitry 120, rather than dissipated as waste heat.

Figure 4:
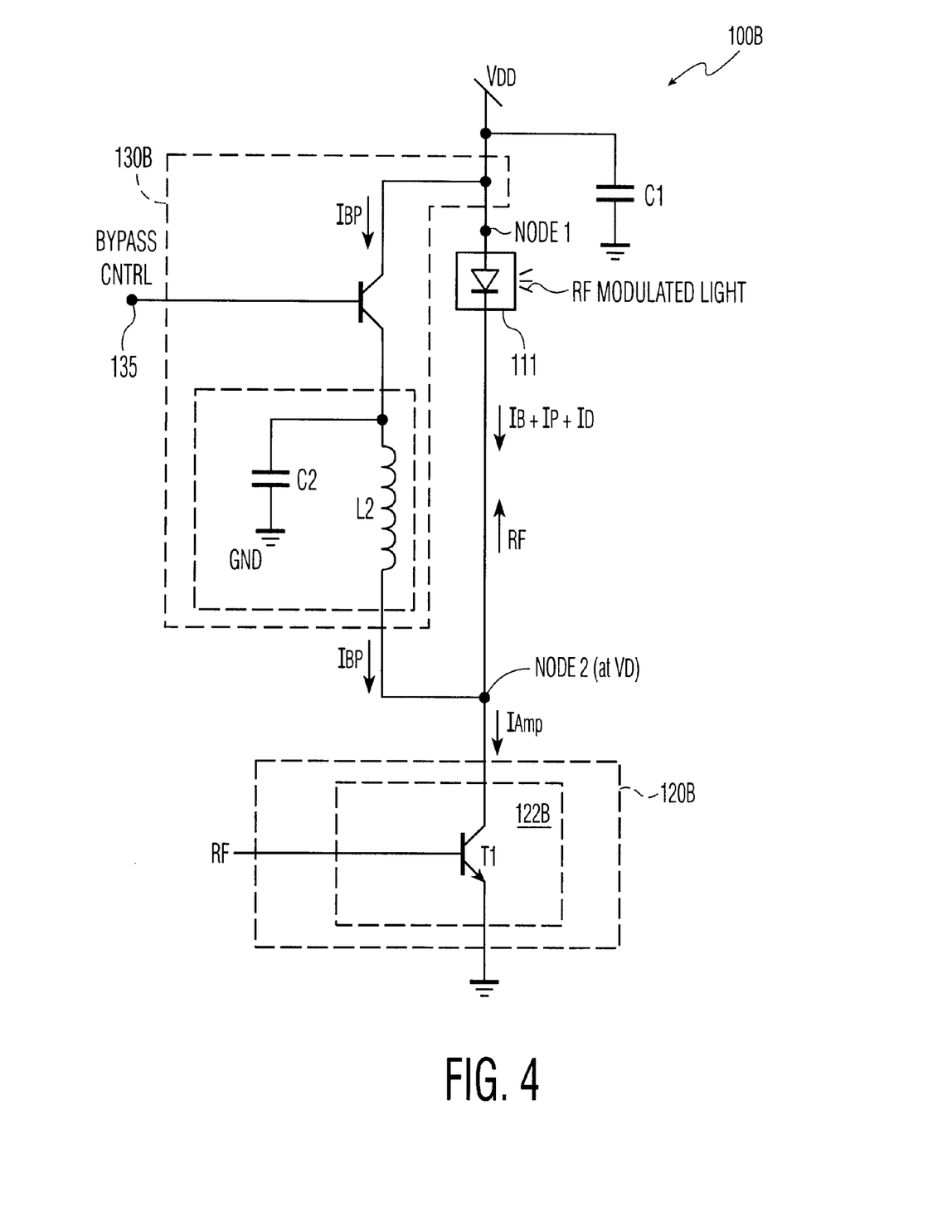
FIG. 4 is a circuit diagram depicting a simple RF laser drive circuit wherein a laser diode-bypassing current controller is added to regulate the current through the laser diode and into the RF amplifier connected in series with the laser diode, in accordance with embodiments of the invention.

FIG. 4 is a circuit diagram depicting a simple RF laser drive circuit 100B having the laser diode bypass topology depicted in FIG. 3 and RF circuitry 120B that includes a very simple RF Amplifier 122B. RF Amplifier 122B includes a single transistor $T_1$ connected between Node2 of the diode 111 and GND, (e.g., a bipolar transistor $T_1$ that may be biased to a quiescent state with current $I_{AMP}$ supplied from Node2 at reduced supply voltage $V_D$. The RF Amplifier 122B amplifies the radio frequency voltage signal RF and transforms that signal into RF modulated current ($I_P$) which is used in the forward biased laser diode 111 to create RF modulated light. The current $I_{AMP}$ includes the laser bias current ($I_B$) plus any laser-bypassing current ($I_{BP}$) passing through the current controller 130B). Thus, the RF circuitry 120B (e.g., comprised of single transistor) passes the RF drive-current $I_P$ and the DC bias current ($I_B$) and any DC diode bypass-current ($I_{BP}$).

Figure 5:
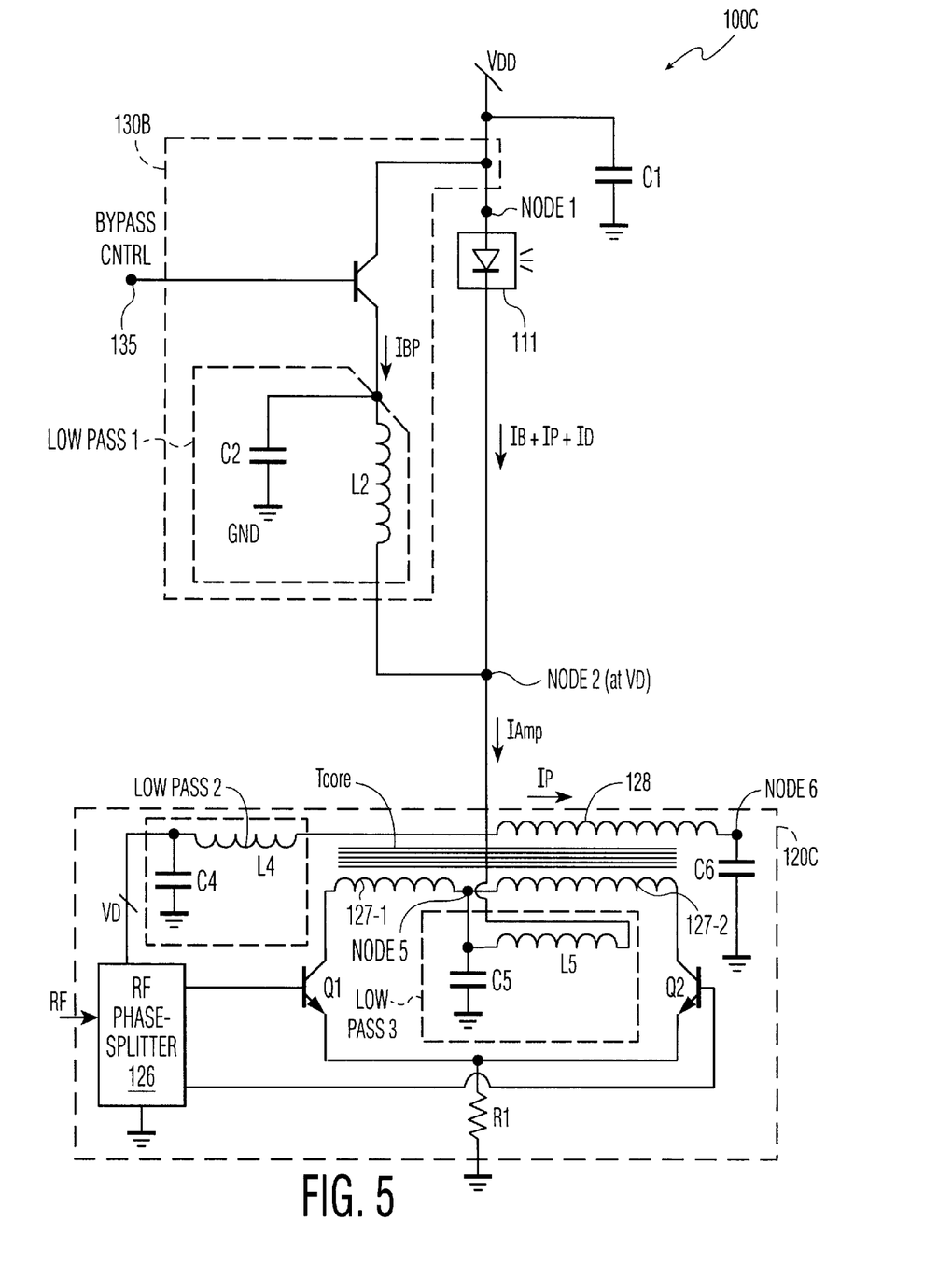
FIG. 5 is a circuit diagram depicting a RF laser drive circuit wherein the RF amplifier includes a push-pull amplifier connected in series with the laser diode, in accordance with embodiments of the invention.
Figure 6:
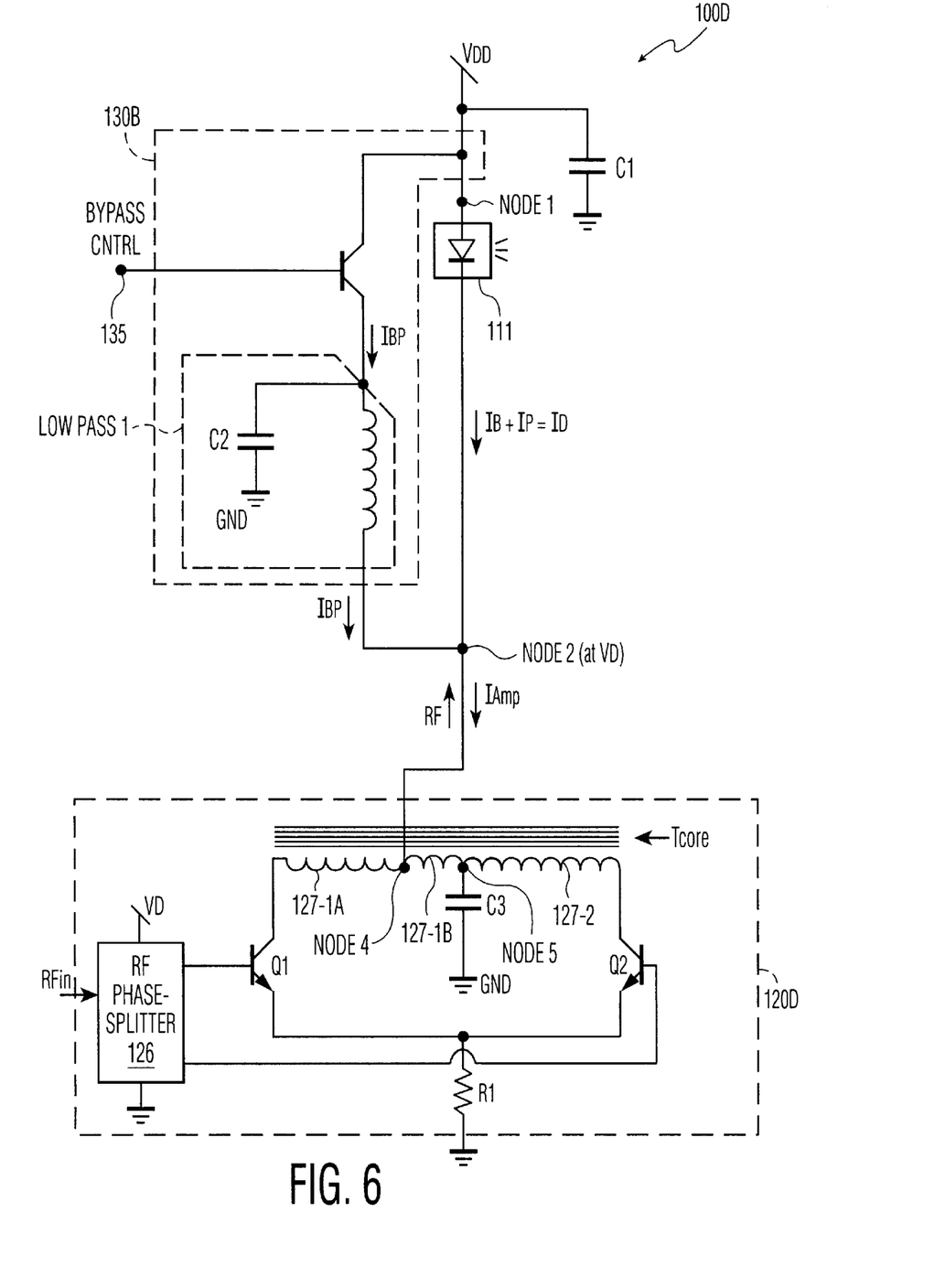
FIG. 6 is a circuit diagram depicting a RF laser drive circuit wherein the RF amplifier includes an asymmetric push-pull amplifier connected in series with the laser diode, in accordance with embodiments of the invention.

The laser diode-bypassing current ($I_{BP}$) passing through current controller 130B can be controlled externally by applying a voltage signal to bypass control terminal 135. A lowpass filter (i.e., a filter that passes DC current, but which blocks RF signals), e.g., LOWPASS1 (including inductor L2 and capacitor C2), may be provided within the laser-diode bypassing current ($I_{BP}$) path (i.e, within current controller 130B), to direct the RF modulated current ($I_P$) that is controlled by the RF circuitry 120 (including 120B, 120C, and 120D as shown in FIGS. 4, 5, and 6 respectively) exclusively through the laser diode 111, rather than through the current controller 130B. A capacitor C1 may be provided at or near Node1 (i.e., on the opposite side of the laser diode 111 away from the RF circuitry 120B) in order to operate as a RF ground, to facilitate passage of the RF modulated current ($I_P$) through the laser diode 111. In alternative embodiments of the invention, the single-transistor RF amplifier may be replaced with any conventional amplifier circuit that would have the appropriate DC and RF characteristics between Node1 and GND, such as for example a Darlington transistor set, and other multiple-transistor amplifiers, and the push-pull amplifier circuits of FIGS. 5 and 6.

FIG. 5 is a circuit diagram depicting a RF laser drive circuit 100C wherein the RF circuitry 120C includes a push-pull amplifier (also referred to in the art as a Hybrid amplifier), in accordance with embodiments of the invention. The push pull (Hybrid) amplifier, as will be well understood by persons skilled in the art, operates in conjunction with a RF phase splitter 126 to transform the signal RF into RF modulated current ($I_P$) superimposed upon a DC bias current (which passes alternately through transistors Q1 and Q2) that will be equal to $I_{BP}$ plus $I_B$ (or less than $I_{BP}$ plus $I_B$ if some current supplied from Node2 at reduced supply voltage $V_D$ is simultaneously used to power the RF phase splitter or other RF components within RF circuitry 120C). The push pull amplifier includes two transistors (Q1 and Q2) which may be bipolar transistors biased to the quiescent point by the current $I_{AMP}$ supplied from Node2 at reduced supply voltage $V_D$. The push pull amplifier within RF circuitry 120C may be alternatively implemented with any other type of switching device, such as metal oxide semiconductor field effect transistor (MOSFET) switches that may be substituted for bipolar transistors (Q1 and Q2). The push pull amplifier within RF circuitry 120C further includes three magnetically-coupled coils (127-1 and 127-2 and 128) connected to form a transformer that has a centertapped dual primary windings (i.e., coils 127-1 and 127-2) and a secondary winding 128 that are magnetically coupled through transformer core Tcore. Each of the dual primary windings 127-1 and 127-2 is RF-grounded by capacitor C5 connected at the centertap of the transformer. The secondary winding 128 is electrically coupled to the laser diode 111, generates RF modulated current $I_P$, and is RF-grounded by capacitor C6. Lowpass filter LOWPASS 3 (comprising inductor coil L5) prevents the RF modulated current IP generated by the magnetically coupled secondary winding 128 from being shorted (i.e., RF-grounded) through capacitor C5, while permitting DC current (e.g., $I_B$ and $I_{BP}$) to flow throw the transformer into the RF circuitry 120C.

Just as in the single-transistor RF amplifier 122B of FIG. 4, the push pull amplifier within RF circuitry 120C amplifies the radio frequency voltage signal RF and transforms that signal into RF modulated drive-current ($I_P$) which is used in the forward biased laser diode 111 to create RF modulated light. The DC component of current $I_{AMP}$ includes the laser bias current ($I_B$) plus any laser-bypassing current ($I_{BP}$) passing through the current controller 130B, and passes to ground through RF circuitry 120C. Thus, the RF circuitry 120C passes the RF drive-current $I_P$ and the DC bias current ($I_B$) and any DC diode bypass-current ($I_{BP}$). The push-pull amplifier output stage and its RF active components (Q1, Q2, 127-1, 127-2) included within the RF circuitry 120C pass the RF drive-current $I_P$ and at least a portion of each of the DC bias current ($I_B$) and any DC diode bypass-current ($I_{BP}$).

If the RF circuitry 120C supplied by Node2 at reduced supply voltage $V_D$ includes circuits (such as the RF phase splitter 126 within RF circuitry 120C) other than the push pull amplifier output stage (Q1, Q2, 127-1, 127-2, and R1), then a portion of the DC component of current $I_{AMP}$ from Node2 may be diverted to supply such circuits (e.g., RF phase splitter 126) through a lowpass filter e.g., LOWPASS2 (including inductor L4 and capacitor C4). The lowpass filter (e.g, LOWPASS2) within current controller RF circuitry, will direct the RF modulated drive-current ($I_P$) that is controlled by the push pull amplifier output stage (Q1, Q2, 127-1, 127-2, and R1), exclusively through the laser diode 111, rather than through the other circuits within RF circuitry 120C. In some alternative embodiments, it may be possible to supply DC power to such other circuits within RF circuitry 120C by tapping the DC currents $I_B$ and $I_{BP}$ from Node5 (the centertap of the transformer RF-grounded by C5) or from Node6 (between secondary coil 128 and capacitor C6), instead of by providing a parallel DC current tap/path through LOWPASS2.

FIG. 6 is a circuit diagram depicting a RF laser drive circuit 100D wherein the RF circuitry 120D includes an asymmetric push-pull (Hybrid) amplifier connected in series with the laser diode 111, in accordance with embodiments of the invention. The asymmetry of the push-pull amplifier enables it to generate an RF modulated current $I_P$ without a distinct separately RC-grounded secondary winding as in FIG. 5. The magnetically coupled coils (127-1A, 127-1B, and 127-2) have an impedance ratio of 1:N. The impedance ratio N (where N is a positive number) may be manipulated to match the push-pull amplifier's impedance to the laser diode's impedance. Typically, N is between 1 and 4 to match a 35–75 ohm push-pull amplifier impedance to a 5–50 ohm laser impendence. Just as in the symmetrical push-pull amplifier design (e.g., 120C of FIG. 5) the asymmetrical push-pull amplifier output stage included within the RF circuitry 120D passes the RF drive-current $I_P$ and at least a portion of each of the DC bias current ($I_B$) and any DC diode bypass-current ($I_{BP}$).

Figure 7:
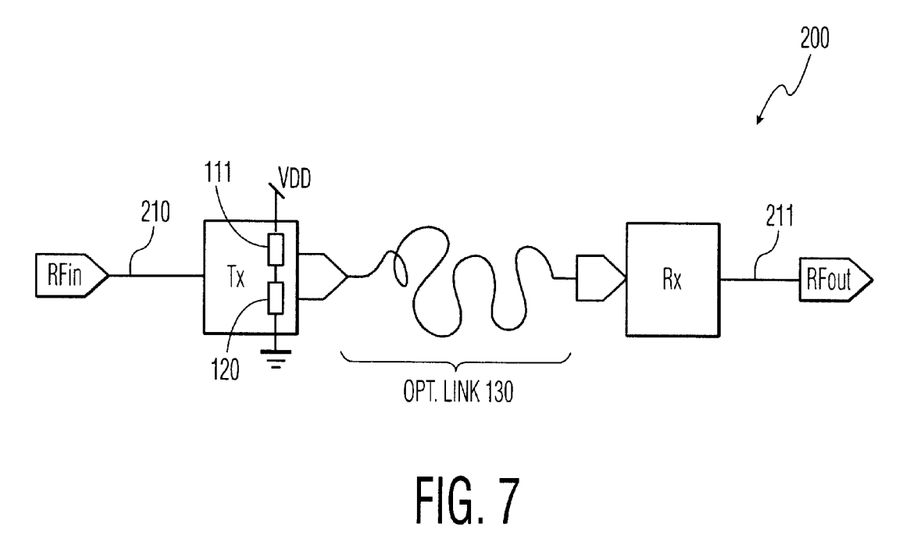
FIG. 7 is a block diagram depicting a RF digital signal transmission system including a transmitter including a RF laser drive circuit having a topology as in FIG. 2 in accordance with embodiments of the present invention.

FIG. 7 is a block diagram depicting a RF digital signal transmission system 200 including a transmitter Tx including a RF laser drive circuit 100 having either a general topology as in FIG. 2 or as in FIG. 3, in accordance with embodiments of the present invention, and further including receiver Rx. The RF digital signal transmission system 200 is for transmission of informational signals (i.e. informational signals carried into the system 200 as RF electronic signals RFin, and out of the system as RF electronic signals RFout) through an optical link 130 (e.g., fiber optic cable) that operatively connects the transmitter Tx to the receiver Rx. The system 200 includes an external conductor 210 for carrying in radio frequency (RF) digital information signals as electronic signals RFin. The system 200 also includes an external conductor 211 for carrying out the radio frequency (RF) digital informational signals as electronic signals RFout.

Embodiments of the present invention have been disclosed. A person of ordinary skill in the art would realize, however, that certain modifications would come within the teachings of this invention. Therefore, the following claims should be studied to determine the true scope and content of the invention.

We claim:

1. A laser transmitter bias circuit comprising:
   a laser diode having a DC bias-current ($I_B$) and a radio frequency (RF) modulated RF drive-current ($I_P$); and
   a drive-current supply unit adapted to pass the DC bias-current ($I_B$) and the RF drive-current ($I_P$) through said laser diode, wherein said drive-current supply unit includes a single amplifier that provides the RF drive-current ($I_P$) and the DC bias-current ($I_B$).

2. The circuit of claim 1, wherein the output stage of said single amplifier includes at least one RF-controlled transistor that passes the RF drive-current ($I_P$) and passes at least a portion of the DC bias-current ($I_B$).

3. The circuit of claim 1, wherein the output stage of said single amplifier includes a RF push-pull amplifier that passes the RF drive-current ($I_P$) and passes a first portion of the DC bias-current ($I_B$).

4. The circuit of claim 3, wherein the push-pull amplifier has magnetically coupled dual primary coils that pass the first portion of the DC bias-current ($I_B$).

5. The circuit of claim 4, wherein the push-pull amplifier has a magnetically coupled secondary coil that passes the RF drive-current ($I_P$).

6. The circuit of claim 3, wherein the push-pull amplifier has asymmetrical magnetically coupled coils that pass the first portion of the DC bias-current ($I_B$).

7. The circuit of claim 3, wherein the push-pull amplifier has two symmetrical RF switching transistors that pass the first portion of the DC bias-current ($I_B$).

8. A laser transmitter bias circuit comprising:
   a laser diode having a DC bias-current ($I_B$) and an RF drive-current ($I_P$); and a push-pull (Hybrid) RF amplifier connected in series with the laser diode between the supply voltage ($V_{DD}$) and ground, wherein the push-pull (Hybrid) RF amplifier provides the RF drive-current ($I_P$) and the DC bias-current ($I_B$).

9. The circuit of claim 8, wherein the push-pull (Hybrid) RF amplifier passes the RF drive-current ($I_P$) and all of the DC bias-current ($I_B$).

10. The circuit of claim 8, wherein the push-pull (Hybrid) RF amplifier is substantially symmetrical.

11. The circuit of claim 8, wherein the push-pull (Hybrid) RF amplifier is asymmetrical.

12. The circuit of claim 8, further comprising a diode-bypass current ($I_{BP}$) path, wherein the diode-bypass current ($I_{BP}$) path is connected in parallel with the laser diode, and the diode-bypass current ($I_{BP}$) path is connected in series with the push-pull (Hybrid) RF amplifier.

13. The circuit of claim 8, wherein a diode-bypass current ($I_{BP}$) passing through the diode-bypass current ($I_{BP}$) path is variable.

14. A laser transmitter bias circuit comprising:
   a laser diode having a DC bias-current ($I_B$) and an RF drive-current ($I_P$);
   a drive-current supply unit for passing the DC bias-current ($I_B$) and the RF drive-current ($I_P$) through said laser diode, wherein said drive-current supply unit includes a single amplifier that provides the RF drive-current ($I_P$) and the DC bias-current ($I_B$); and
   a diode-bypass current ($I_{BP}$) path, wherein the diode-bypass current ($I_{BP}$) path is connected in parallel with the laser diode, and the diode-bypass current ($I_{BP}$) path is connected in series with the drive-current supply unit.

* * * * *